Oct. 24, 1967 L. B. SMITH 3,349,340
CRYSTAL CONTROLLED OSCILLATOR WITH REDUCED POWER SUPPLY NOISE SENSITIVITY
Filed March 31, 1965
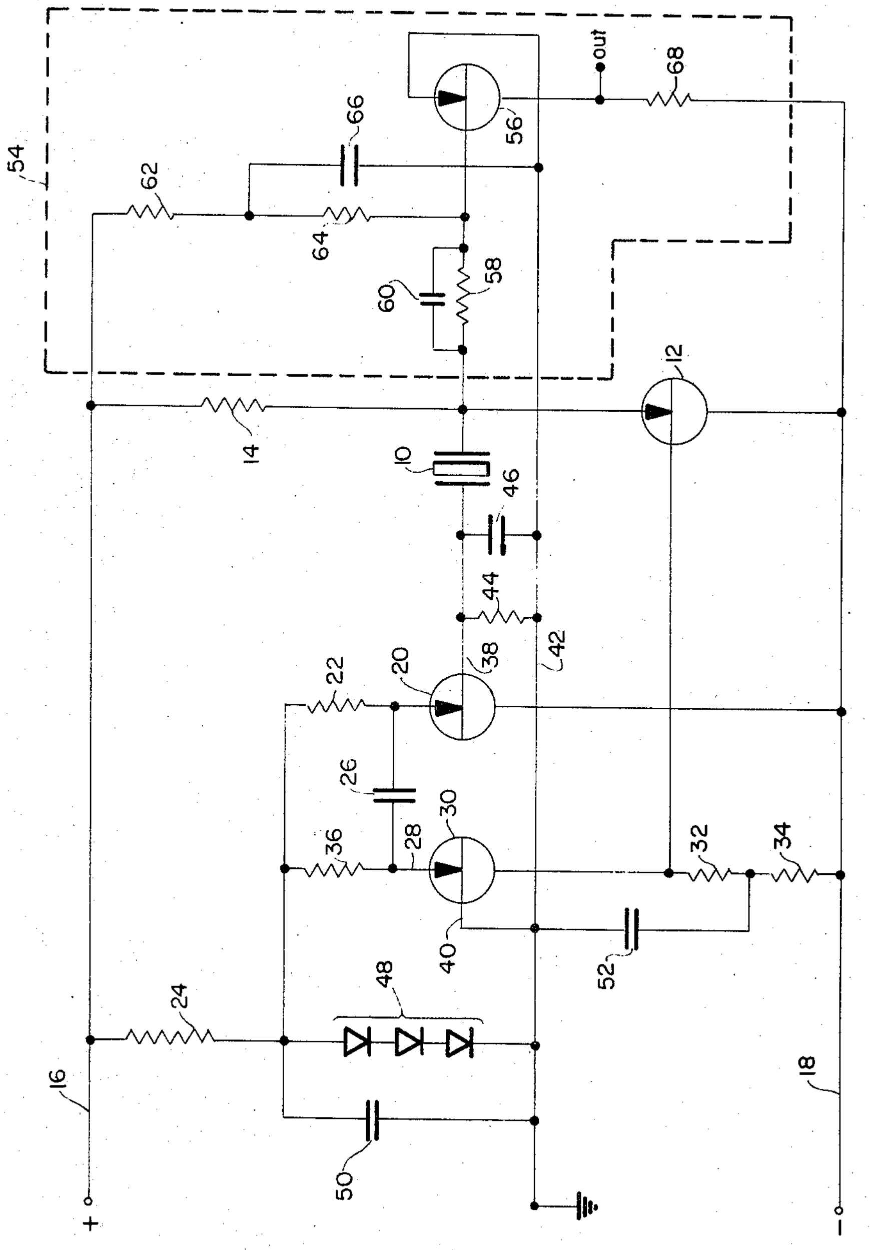
INVENTOR.
LELAND B. SMITH
BY T E Kristofferson
ATTORNEY United States Patent Office 3,349,340
Patented Oct. 24, 1967

3,349,340

CRYSTAL CONTROLLED OSCILLATOR WITH REDUCED POWER SUPPLY NOISE SENSITIVITY

Leland Bryan Smith, Whittier, Calif., assignor to Beckman Instruments, Inc., a corporation of California
Filed Mar. 31, 1965, Ser. No. 444,305
4 Claims. (Cl. 331—116)

ABSTRACT OF THE DISCLOSURE

A crystal oscillator is illustrated having a crystal coupled through a first emitter-follower stage to a common base amplification stage which drives into a second emitter-follower, which in turn drives the crystal. The output is provided with a buffer switch stage, coupled to the second emitter-follower. The first emitter-follower and common base stage are coupled to one power supply line by referencing their bases to ground and connecting series rectifiers to provide a source of low impedance constant voltage drop from the ground to the extremity of their emitter impedances, away from the emitter. The magnitude of the emitter impedance is selected to keep common mode amplification low. An impedance of large magnitude with respect to the impedance of the rectifier is placed in series with the rectifier between the one power supply line and ground.

This invention relates to a crystal controlled oscillator and more particularly, to such an oscillator which is stable over a wide range of frequencies and relatively insensitive to power supply noise and cross-coupling.

In the prior art, a need has existed for oscillators which can accommodate a wide range of frequencies, for example, from 3 kilocycles to 1 megacycle, and still maintain frequency accuracies with power supply variations running as high as plus or minus 15% and noise on 12-volt power supplies running as high as 4 volts, peak to peak. Also, when a number of oscillators have been operated independently, off of a common power supply, phase-lock problems have arisen.

The circuits used in attempting to accomplish the above have employed such things as soft resistor divider bias circuits, which are particularly sensitive to power supply variations, and have used such networks as RC and RCL to provide a proper phase shift for causing oscillation. This has resulted in a need to tune the oscillator to obtain oscillation. The accuracy of the phase shift would depend upon the stability and accuracy of the components. The output of the oscillator stage was either a linear sinusoid or a soft square-wave which was conditioned by Schmitt triggers and Darlington switches. Such oscillators have all been subject to a loss of control under noise conditions. Accordingly, it is an object of this invention to provide an oscillator which can accommodate a wide range of frequencies and which will be relatively insensitive to noise in the power supply.

Another object of the invention is to employ such an oscillator using crystal control in the series resonant mode of operation.

Still another object of the invention is to provide such an oscillator employing means for attenuating high currents and amplifying low currents caused by variations in impedances of crystals used in the high and low frequency ranges.

A further object of the invention is to provide such an oscillator which will drive a capacitive gate with proper impedance matching.

A still further object of the invention is to provide such an oscillator such that more than one such oscillator, or such an oscillator and other circuits such as switching circuits which may cause spikes or square-waves in the power supply output, may be coupled to a common power supply without deleterious cross-coupling with resulting phase-lock.

In carrying out the invention in one form thereof, a crystal oscillator, operating in the series resonant mode, is provided in which a crystal is coupled through a first emitter follower stage to a common base amplification stage which drives into a second emitter follower stage. The second emitter follower stage, in turn, drives the crystal. The oscillator output is provided with an output buffer switch stage coupled to the output of the second emitter follower. The first emitter follower and common base stages are coupled to one power supply line by referencing their bases to ground and connecting series rectifiers, to provide a source of low impedance constant voltage drop from the ground to the extremity of their emitter impedances, away from the emitter. The magnitude of the emitter impedance of the common base stage may be selected to keep the common mode amplification factor sufficiently low. An impedance, large with respect to the dynamic impedance of the rectifiers, is placed in series with the rectifiers between the one power supply line and ground. A capacitor may be shunted around the rectifiers to provide a path for high frequency. The collectors of the first emitter follower and common base stages are coupled to another power supply line, with the collector impedance of the amplification stage largely capacitively degenerated.

The novel features characteristic of the invention are set forth with particularity in the appended claims. The invention itself, however, together with further objects and advantages thereof, can best be understood by reference to the following description taken in connection with the accompanying drawing which illustrates one embodiment of the invention.

Turning now to the drawing, a crystal 10 is driven by an emitter follower including a transistor 12 having its emitter coupled through a resistor 14 to a positive power supply line 16, and its collector coupled directly to a negative power supply line 18. The crystal, in turn, drives a second emitter follower stage including a transistor 20. One side of the crystal 10 is connected to the emitter of the transistor 12 and the other side of the crystal 10 is connected to the base 38 of the transistor 20. The collector of transistor 20 is connected directly to line 18 and the emitter, through series resistors 22 and 24, to line 16.

Emitter follower transistor 20, in turn, is coupled by means of a capacitor 26 from its emitter to the emitter 28 of a common base transistor 30, which provides an amplification stage. The collector of common base transistor 30 is connected through series resistors 32 and 34 to line 18 and the emitter 28 is connected through a resistor 36 to the junction point between resistors 22 and 24.

The input impedance of the emitter follower 20 can provide a negative feedback to the crystal 10 which becomes stronger as the crystal impedance decreases. This, in effect, will increase the impedance of the crystal and provide an AGC in the feedback circuit. The emitter follower 20 can also provide current gain and thus, an improvement in the ability to drive the emitter 28 with higher impedance crystals.

The bias of bases 38 and 40 of the emitter follower 20 and common base stage 30, respectively, would be sensitive to voltage variations caused by any associated power supply. A circuit is provided with a means for providing bias stability and power supply noise immunity. This will permit the use of several such oscillators, operating off a single power supply without interaction between oscillators which could cause undesired frequency or phase-lock between oscillators. It also serves to provide isolation from switches and other circuits which cause spikes or square-waves to appear in the power supply output. In order to do this, bases 38 and 40 are ground-referenced so that power stability is reflected in the collector current and not in the base bias. Base 38 is connected to a ground line 42 through a resistor 44, which is paralleled by a capacitor 46. Base 40 is directly connected to ground line 42. Series diodes 48, with a parallel capacitor 50, are connected between the ground line 42 and the junction between resistors 22 and 24. These diodes are provided for decoupling of the power supply.

The common mode gain for power supply noise, for signals occurring on the plus power supply line 16, is kept low by resistor 36. Power supply noise on negative power supply line 18 is degenerated by a capacitor 52, which is connected from the junction point between resistors 32 and 34, to ground line 42.

The output of the common base transistor 30 is coupled from its collector to the base of transistor 12, closing the feedback loop to the crystal 10. The overall output of this oscillator circuit will be a squarewave, which appears on the emitter resistance 14 of the emitter follower 12. This is coupled through the switch 54, including the transistor 56, by coupling the emitter of transistor 12 through the parallel combination of a resistor 58 and a capacitor 60 to the base of transistor 56. The emitter of transistor 56 is connected to ground line 42. The positive power supply line 16 is connected, by way of resistors 62 and 64, to the base of transistor 56. The junction of resistors 62 and 64 is connected to the ground line 42 through a capacitor 66. A collector resistor 68 is connected from the collector of transistor 56 to the negative supply line 18. The switch 54 is connected to the output to provide a gate-driving ability in order to drive capacitive gates from the proper low impedance. It is essentially an impedance transformer.

The capacitor 46 is connected across the base resistor 44 to suppress crystal operation in harmonic modes. It serves to neutralize amplifier capacitive phase-shift. Three such capacitors may be used in different frequency ranges, as follows:

| | | |
|---|---|---|
| 2.4 kc.–6 kc. | microfads | .0022 |
| 6 kc.–60 kc. | picofarads | 390 |
| 60 kc.–330 kc. | do | 51 |
| 330 kc.–2 mc. | | None required |

Other values for the components employed in the circuit of the embodiment illustrated in a preferred arrangement, are as follows:

| | |
|---|---|
| Voltage on lines **16** and **18** | ±12 volts. |
| Diodes **48** | 28869 Beckman Standard Logic Diodes. |
| Transistors **12**, **20** and **30** | 2N2188. |
| Transistor **56** | Beckman Digital Switch 851–099. |
| Resistor **22** | 1800 ohms. |
| Resistors **24**, **36** and **62** | 1000 ohms. |
| Capacitors **50**, **52** and **66** | 15 microfarads. |
| Coupling capacitor **26** | 20 microfarads. |
| Resistor **32** | 3900 ohms. |
| Resistor **34** | 330 ohms. |
| Resistors **14** and **64** | 5600 ohms. |
| Resistor **58** | 2200 ohms. |
| Capacitor **60** | 100 picofarads. |
| Resistor **68** | 820 ohms. |

In the circuit, as illustrated and described above, the series resonance impedance variation of the crystals is from a maximum of 150,000 ohms to a minimum of 50 ohms. When the crystal is driven by a 12-volt signal, the control current will vary from 240 milliamps at the high frequencies to 80 microamps at the lower frequencies, which necessitates means for attenuating the higher current and amplifying the lower currents, thus, the use of the emitter follower 20.

The dynamic impedance of the three series rectifier diodes 48 is approximately 10 ohms so that with the 1,000 ohm series resistor 24, positive power is degenerated 100 to 1. The common mode gain is set by resistor 36 at 4. The net result is a rejection of power supply noise and variations of 25 to 1.

With 8-volt peak to peak square-waves driving the ±12-volt supplies on lines 16 and 18, at frequencies including the operating frequency of the oscillator, the oscillator frequency changed no more than one count in $10^6$, which is within the resolution of the associated counter used with the oscillator.

It will be obvious to those skilled in the art that various modifications of the circuit, employed to implement the embodiment illustrated, may be made. While a particular embodiment has been discussed, it will be understood that the invention is not limited thereto and that it is contemplated to cover any such modifications as fall within the true spirit and scope of the invention by the appended claims.

What is claimed as new and desired to be secured by Letters Patent of the United States is:

1. A crystal controlled oscillator capable of operating from a power supply containing sharp spike and square-wave noise in the frequency range of the oscillator, comprising;

a crystal, a first emitter follower, a second emitter follower, and a common base amplification stage;

means connecting the output of said first emitter follower to said crystal to drive said crystal;

means connecting the output of said crystal through said second emitter follower to the input of said amplification stage to drive said amplification stage and provide matching means for a variety of crystal impedances;

means connecting the output of said amplification stage to the input of said first emitter follower;

a pair of power supply lines of different potential and a common line of intermediate potential;

means for biasing said first and second emitter followers and said common base stage from said pair of lines and decoupling said second emitter follower stage and said amplification stage from variations in the potential of said pair of lines, including means coupling the bases of said second emitter follower and amplification stage to said common line, means including a series resistance and constant potential rectifier coupling one of said pair of lines to said common line, means for biasing the base emitter circuits of said second emitter follower stage and amplification stage from across said constant potential rectifier, and means coupling the collectors of said second emitter follower stage and said amplification stage to the other of said pair of lines; and, means for taking an output from said first emitter follower.

2. The oscillator of claim 1 in which said means for taking an output includes an impedance transforming transistor switch for providing a low output impedance.

3. The oscillator of claim 1 in which said means coupling the collector of said amplification stage to the other of said pair of lines includes two series resistors connected from the collector of said amplification stage to the other of said pair of lines and capacitive degenerating means connected between said common line and the junction of said two series resistors.

4. The oscillator of claim 3 in which said means for taking an output includes an impedance transforming transistor switch for providing a low output impedance.

References Cited

UNITED STATES PATENTS

| | | | |
|---|---|---|---|
| 3,137,826 | 6/1964 | Boudrias | 331—116 X |
| 3,217,269 | 11/1965 | Rowley et al. | 331—159 X |
| 3,303,436 | 2/1967 | Krausz | 331—116 |

ROY LAKE, *Primary Examiner.*

J. B. MULLINS, *Assistant Examiner.*